(12) United States Patent
Chung (10) Patent No.: US 12,344,444 B2
(45) Date of Patent: Jul. 1, 2025

(54) QUICK-RELEASE POSITIONING MEMBER AND OPENABLE AND CLOSABLE DEVICE

(71) Applicant: LEOTEK CORPORATION, Taipei (TW)

(72) Inventor: Fu-Chin Chung, Taipei (TW)

(73) Assignee: LEOTEK CORPORATION, Taipei (TW)

( * ) Notice: Subject to any disclaimer, the term of this patent is extended or adjusted under 35 U.S.C. 154(b) by 189 days.

(21) Appl. No.: 18/330,372

(22) Filed: Jun. 7, 2023

(65) Prior Publication Data

US 2024/0327077 A1   Oct. 3, 2024

(30) Foreign Application Priority Data

Mar. 31, 2023   (TW) ................................ 112203063

(51) Int. Cl.
| | |
|---|---|
| *B65D 43/16* | (2006.01) |
| *B65D 43/24* | (2006.01) |
| *B65D 55/04* | (2006.01) |

(52) U.S. Cl.
CPC ......... *B65D 43/161* (2013.01); *B65D 43/163* (2013.01); *B65D 43/24* (2013.01); *B65D 55/04* (2013.01)

(58) Field of Classification Search
CPC .... B65D 43/161; B65D 43/163; B65D 43/24; B65D 55/04; H05K 5/03
USPC .................................... 220/831, 832; 16/335
See application file for complete search history.

(56) References Cited

U.S. PATENT DOCUMENTS

| | | | | | |
|---|---|---|---|---|---|
| 1,232,963 | A | * | 7/1917 | Parkins .................. | B62D 25/04 296/30 |
| 2,707,064 | A | * | 4/1955 | Castello .................. | E05C 17/38 217/60 E |
| 2,732,972 | A | * | 1/1956 | Anschicks ........... | B65D 43/167 220/88.1 |
| 4,119,239 | A | * | 10/1978 | Anderson .......... | B65D 43/0212 220/784 |
| 4,524,496 | A | * | 6/1985 | Tehsildar ............. | A61G 17/032 403/92 |
| 8,464,393 | B2 | * | 6/2013 | Kao ....................... | E05D 11/105 16/292 |
| 10,597,203 | B1 | * | 3/2020 | Chang .................... | B65D 43/24 |

* cited by examiner

*Primary Examiner* — James N Smalley
(74) *Attorney, Agent, or Firm* — JCIPRNET (57) ABSTRACT

A quick-release positioning member, including a fixing portion, a first elastic portion, and a second elastic portion, is provided. The fixing portion is adapted to fix the quick-release positioning member to an object. The first elastic portion is connected to a first side of the fixing portion, extends toward a first direction, and has a first bending area protruding away from the fixing portion. The second elastic portion is connected to a second side of the fixing portion, extends toward the first direction, and has a second blocking area protruding toward the fixing portion. The first and second elastic portions are adapted to be deformed upon exertion of force. The first elastic portion pivots about an axis extending in a second direction. The second elastic portion pivots about an axis extending in a third direction. The first, second, and third directions are substantially orthogonal. An openable and closable device is also provided.

19 Claims, 13 Drawing Sheets

QUICK-RELEASE POSITIONING MEMBER AND OPENABLE AND CLOSABLE DEVICE

CROSS-REFERENCE TO RELATED APPLICATION

This application claims the priority benefit of Taiwan application serial no. 112203063, filed on Mar. 31, 2023. The entirety of the above-mentioned patent application is hereby incorporated by reference herein and made a part of this specification.

BACKGROUND

Technical Field

The disclosure relates to a quick-release positioning member and an openable and closable device, and in particular relates to a quick-release positioning member and an openable and closable device having the quick-release positioning member.

Description of Related Art

The casings of many devices, especially electronic devices, need to be opened and closed multiple times to install or replace internal components for maintenance. For example, the fixtures of street lamps are usually installed on roadside light poles by the staff using tools. However, since the installation and maintenance of the light fixtures must be done at high altitudes, it is inconvenient and time-consuming to install, maintain, and disassemble light fixtures if tools are required. Such operations also extend the time the staff is exposed to dangerous environment as the staff has to spend longer time at high altitudes.

SUMMARY

The disclosure provides a quick-release positioning member, which helps to solve the problem of requiring tools to install, maintain, and disassemble a product attached thereto, and assists a casing of the product to be positioned when the casing is opened and closed to facilitate operation.

The disclosure provides an openable and closable device, which helps to solve the problem of requiring tools to install, maintain, and disassemble a product attached thereto, and assists the casing thereof to be positioned when the casing is opened and closed to facilitate operation.

The quick-release positioning member of the disclosure includes a fixing portion, a first elastic portion, and a second elastic portion. The fixing portion is adapted to fix the quick-release positioning member to an object. The first elastic portion is connected to a first side of the fixing portion. The first elastic portion extends toward a first direction and has a first bending area protruding away from the fixing portion. The second elastic portion is connected to a second side of the fixing portion. The second elastic portion extends toward the first direction and has a second blocking area protruding toward the fixing portion. The first elastic portion and the second elastic portion are adapted to receive force to generate elastic deformation, the first elastic portion pivots about an axis extending in a second direction, the second elastic portion pivots about an axis extending in a third direction, and the first direction, the second direction, and the third direction are substantially orthogonal to each other.

The openable and closable device of the disclosure includes a case, a door body, a movable member, and the quick-release positioning member. The movable member has a shaft portion and a protruding portion extending from the shaft portion. The movable member is disposed on one of the case and the door body, and the quick-release positioning member is disposed on other one of the case and the door body. The movable member is adapted to relatively rotate the door body and the case, and the quick-release positioning member enables the door body and the case to be relatively detachable. The protruding portion of the movable member is adapted to slide on the first elastic portion of the quick-release positioning member, and the first elastic portion is adapted to block the protruding portion from passing through or be forced by the protruding portion to allow the protruding portion to pass through.

In an embodiment of the disclosure, the first elastic portion further includes a first connecting area and a first blocking area. The first connecting area is connected between the fixing portion and the first bending area, and has an angle relative to the fixing portion. The first blocking area is connected to the first bending area, and the first blocking area has a first angle relative to the first bending area.

In an embodiment of the disclosure, the first angle is between 90° and 150°.

In an embodiment of the disclosure, the second elastic portion further includes a second connecting area and a guiding area. The second connecting area is connected between the fixing portion and the second blocking area. The guiding area is connected to the second blocking area.

In an embodiment of the disclosure, a protruding direction of the second blocking area is substantially perpendicular to an extension direction of the second connecting area.

In an embodiment of the disclosure, an extension direction of the guiding area is inclined to a protruding direction of the second connecting area.

In an embodiment of the disclosure, the second elastic portion further includes a force receiving area connected to the guiding area and having an angle relative to the guiding area.

In an embodiment of the disclosure, the fixing portion has an opening.

In an embodiment of the disclosure, the second elastic portion of the quick-release positioning member is adapted to be located on a moving path of the shaft portion to block the shaft portion from passing through or to generate elastic deformation under force to be located outside the moving path of the shaft portion to allow the shaft portion to pass through.

In an embodiment of the disclosure, the case includes a lower cover and an upper cover. The upper cover is disposed on the lower cover. One of the quick-release positioning member and the movable member is adapted to be disposed on one of the lower cover and the upper cover, and other one of the quick-release positioning member and the movable member is adapted to be disposed on the door body.

In an embodiment of the disclosure, the case has a first side wall, a second side wall, and a bottom wall, and the first side wall, the second side wall, the bottom wall, and the second elastic portion surround to accommodate the shaft portion and limit movement of the shaft portion.

Based on the above, in the quick-release positioning member of the disclosure, the first elastic portion and the second elastic portion are adapted to be elastically deformed upon exertion of force. The first elastic portion pivots about an axis extending in the second direction, and the second elastic portion pivots about an axis extending in the third direction, which can help to solve the issue that an installed product needs to cooperate with tools for operations such as installation, maintenance, and disassembly, and can assist the casing of the product to be positionably opened and closed to facilitate operation.

In addition, in the openable and closable device of the disclosure, the movable member is adapted to relatively rotate the door body and the case, and the quick-release positioning member enables the door body and the case to be relatively detachable. The protruding portion of the movable member is adapted to slide on the first elastic portion of the quick-release positioning member, and the first elastic portion is adapted to block the protruding portion from passing through or be forced by the protruding portion to allow the protruding portion to pass through, which can help to solve the issue that the openable and closable device needs to cooperate with tools for operations such as installation, maintenance, and disassembly, and can assist the casing thereof to be positionably opened and closed to facilitate operation.

For the features and advantages of the disclosure to be more comprehensible, the following specific embodiments are described in detail in conjunction with the drawings.

DETAILED DESCRIPTION OF DISCLOSED EMBODIMENTS

Figure 1:
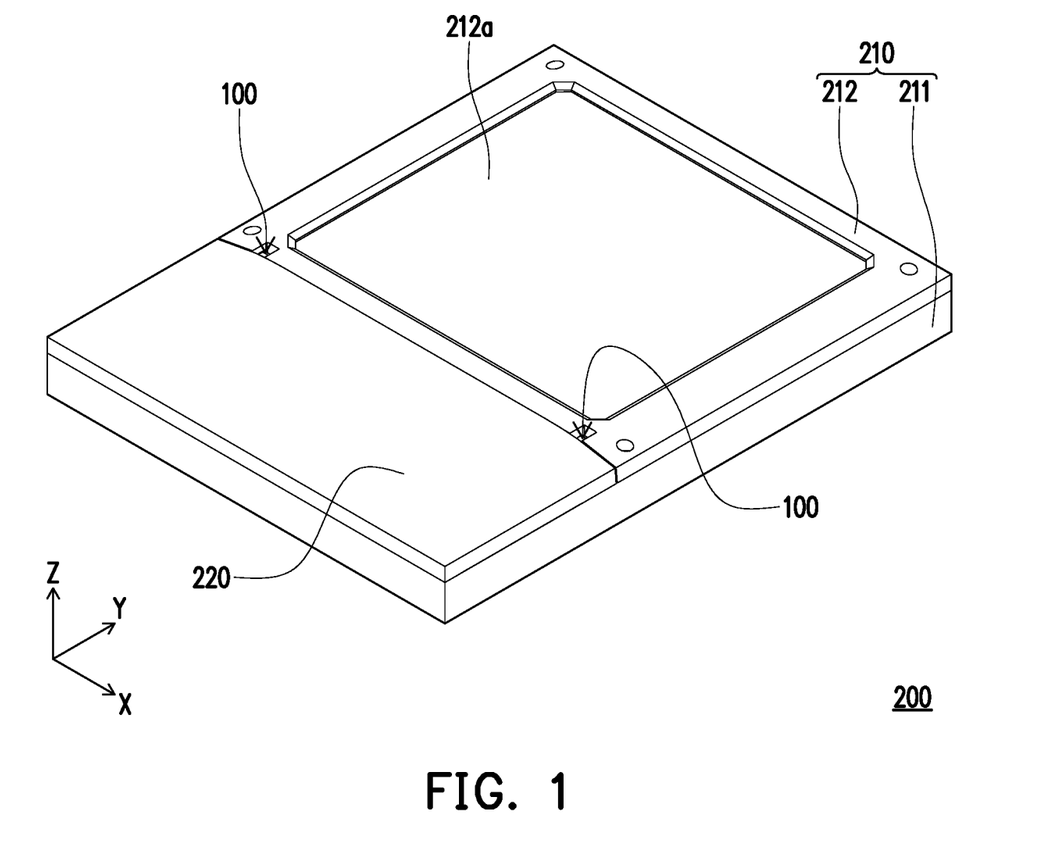
FIG. 1 is a three-dimensional schematic view of an openable and closable device according to an embodiment of the disclosure.
Figure 2:
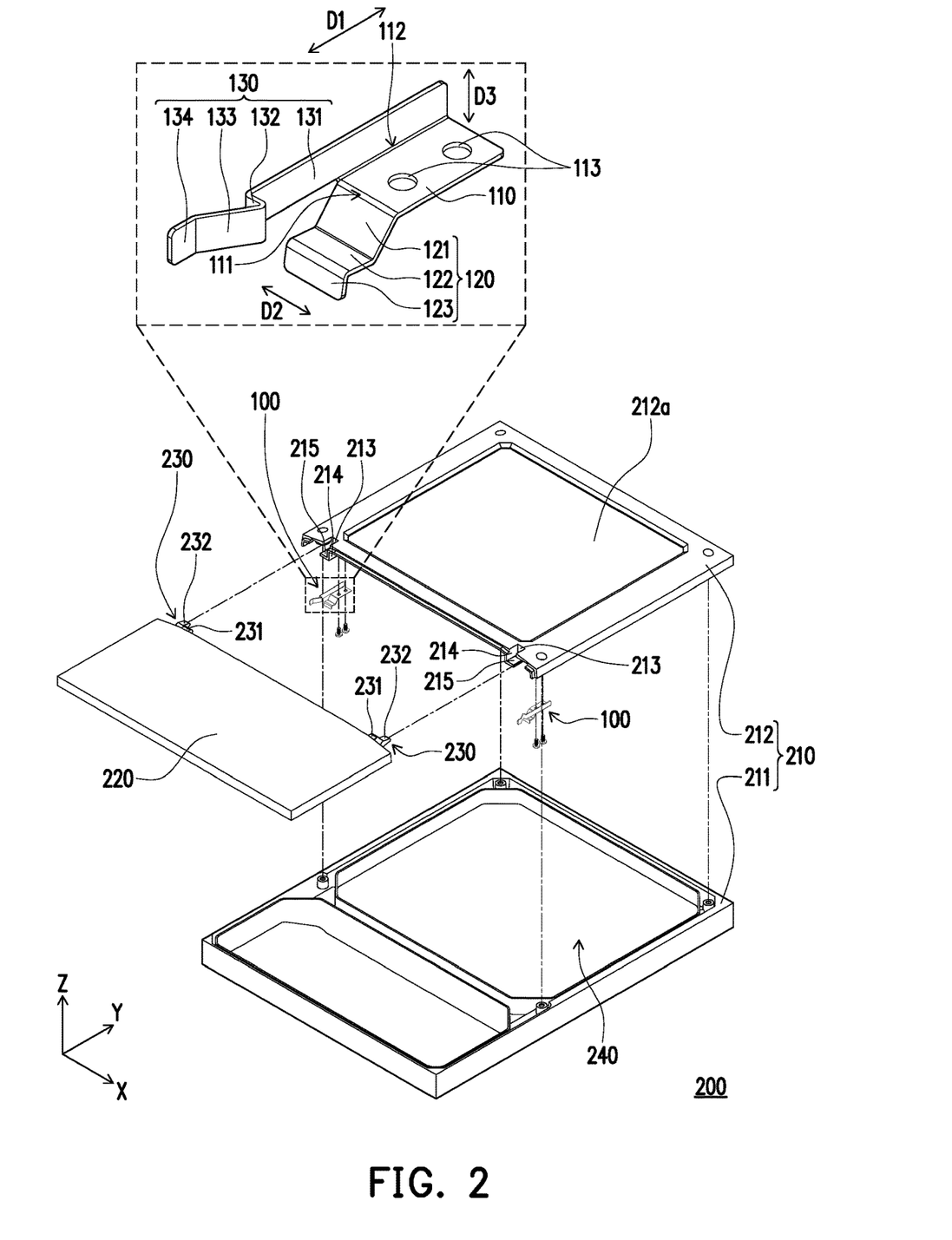
FIG. 2 and FIG. 3 are exploded schematic views of the openable and closable device of FIG. 1 at different viewing angles.
Figure 3:
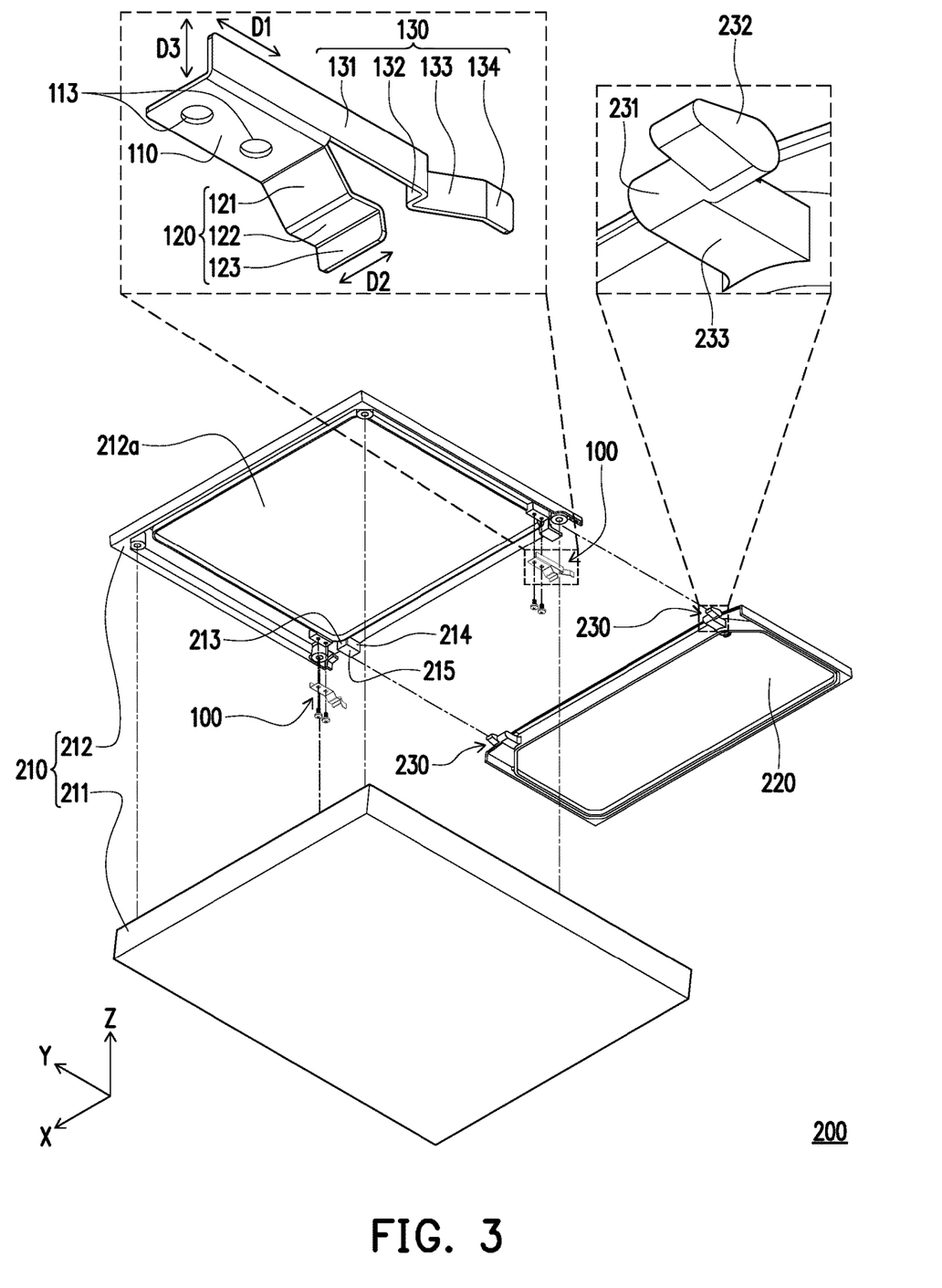

FIG. 1 is a three-dimensional schematic view of an openable and closable device according to an embodiment of the disclosure. FIG. 2 and FIG. 3 are exploded schematic views of the openable and closable device of FIG. 1 at different viewing angles. Cartesian coordinates X-Y-Z are also provided here for ease of description. Please refer to FIG. 1, FIG. 2, and FIG. 3. A quick-release positioning member 100 is suitable for any openable and closable device 200 that needs to quickly disassemble an object from another object. The disclosure is exemplified by an application to a lamp, but the disclosure is not limited thereto. In other embodiments, the application may also be an electronic device.

Specifically, the openable and closable device 200 includes the quick-release positioning member 100, a case 210, a door body 220, and a movable member 230, wherein the movable member 230 is disposed on one of the case 210 and the door body 220, the quick-release positioning member 100 is disposed on the other one of the case 210 and the door body 220, the movable member 230 is adapted to relatively rotate the door body 220 and the case 210, the quick-release positioning member 100 enables the door body 220 and the case 210 to be relatively detachable, and there is an accommodating space 240 between the door body 220 and the case 210 for accommodating an electronic module, such as a power supply module, a communication module, and a sensing module. The openable and closable device 200 may be installed on a roadside light pole.

In particular, for the convenience of description, only the quick-release positioning member 100 and the movable member 230 on one side are described below, persons with ordinary knowledge in the art of the disclosure may comprehend that a symmetrical design can be adopted to the structures and functional principles of the quick-release positioning member 100 and the movable member 230 on the other side. The disclosure will not repeat the details about the quick-release positioning member 100 and the movable member 230 on the other side.

In detail, the quick-release positioning member 100 includes a fixing portion 110, a first elastic portion 120, and a second elastic portion 130. The fixing portion 110 is adapted to fix the quick-release positioning member 100 to an object (which specifically may be the case 210 or the door body 220). The first elastic portion 120 is connected to a first side 111 of the fixing portion 110. The first elastic portion 120 extends toward a first direction D1 and has a first bending area 122 protruding away from the fixing portion 110. The second elastic portion 130 is connected to a second side 112 of the fixing portion 110. The second elastic portion 130 extends toward the first direction D1 and has a second blocking area 132 protruding toward the fixing portion 110. The first elastic portion 120 and the second elastic portion 130 are adapted to be elastically deformed upon exertion of force, the first elastic portion 120 pivots about an axis extending in a second direction D2, and the second elastic portion 130 pivots about an axis extending in a third direction D3, which can help to solve the issue that a product installed by the quick-release positioning member 100 needs to cooperate with tools for operations such as installation, maintenance, and disassembly, and can assist a casing of the product to be positionably opened and closed to facilitate operation.

In the embodiment, the first direction D1 is parallel to the Y axis, the second direction D2 is parallel to the X axis, and the third direction D3 is parallel to the Z axis. In other words, the first direction D1, the second direction D2, and the third direction D3 are substantially orthogonal to each other, but the disclosure is not limited thereto.

The fixing portion 110 has an opening 113 for a fixing member (such as but not limited to a screw) to pass through to fix the quick-release positioning member 100 to the object. It should be noted that the disclosure does not limit the way in which the quick-release positioning member 100 is disposed on the case 210. The opening 113 is only one of the feasible examples exemplified for the convenience of explanation, and the designer may choose various arrangements according to the requirements.

The movable member 230 has a shaft portion 231 and a protruding portion 232 extending from the shaft portion 231, wherein a cross-section of the protruding portion 232 is in the shape of a cam. The protruding portion 232 of the movable member 230 is adapted to slide on the first elastic portion 120 of the quick-release positioning member 100, and the first elastic portion 120 is also adapted to block the protruding portion 232 from passing through or be forced by the protruding portion 232 to allow the protruding portion 232 to pass through, which can help to solve the issue that the openable and closable device 200 needs to cooperate with tools for operations such as installation, maintenance, and disassembly, and can assist a casing thereof to be positionably opened and closed to facilitate operation.

Furthermore, the case 210 includes a lower cover 211 and an upper cover 212. The upper cover 212 is disposed on the lower cover 211. One of the quick-release positioning member 100 and the movable member 230 is adapted to be disposed on one of the lower cover 211 and the upper cover 212, and the other one of the quick-release positioning member 100 and the movable member 230 is adapted to be disposed on the door body 220. In the embodiment, the quick-release positioning member 100 is disposed on the case 210, in particular, on the upper cover 212, and the movable member 230 is disposed on the door body 220 through a connecting portion 233, so that the door body 220 may pass through the quick-release positioning member 100 to be detachably installed on the case 210, but the disclosure is not limited thereto. In addition, the upper cover 212 has a light transmitting portion 212a, so the upper cover 212 may function as a lampshade, but the disclosure is not limited thereto.

In other embodiments, the quick-release positioning member is disposed on the lower cover, and the movable member is disposed on the door body.

In other embodiments, the movable member is disposed on the upper cover, and the quick-release positioning member is disposed on the door body.

In other embodiments, the movable member is disposed on the lower cover, and the quick-release positioning member is disposed on the door body.

Figure 4:
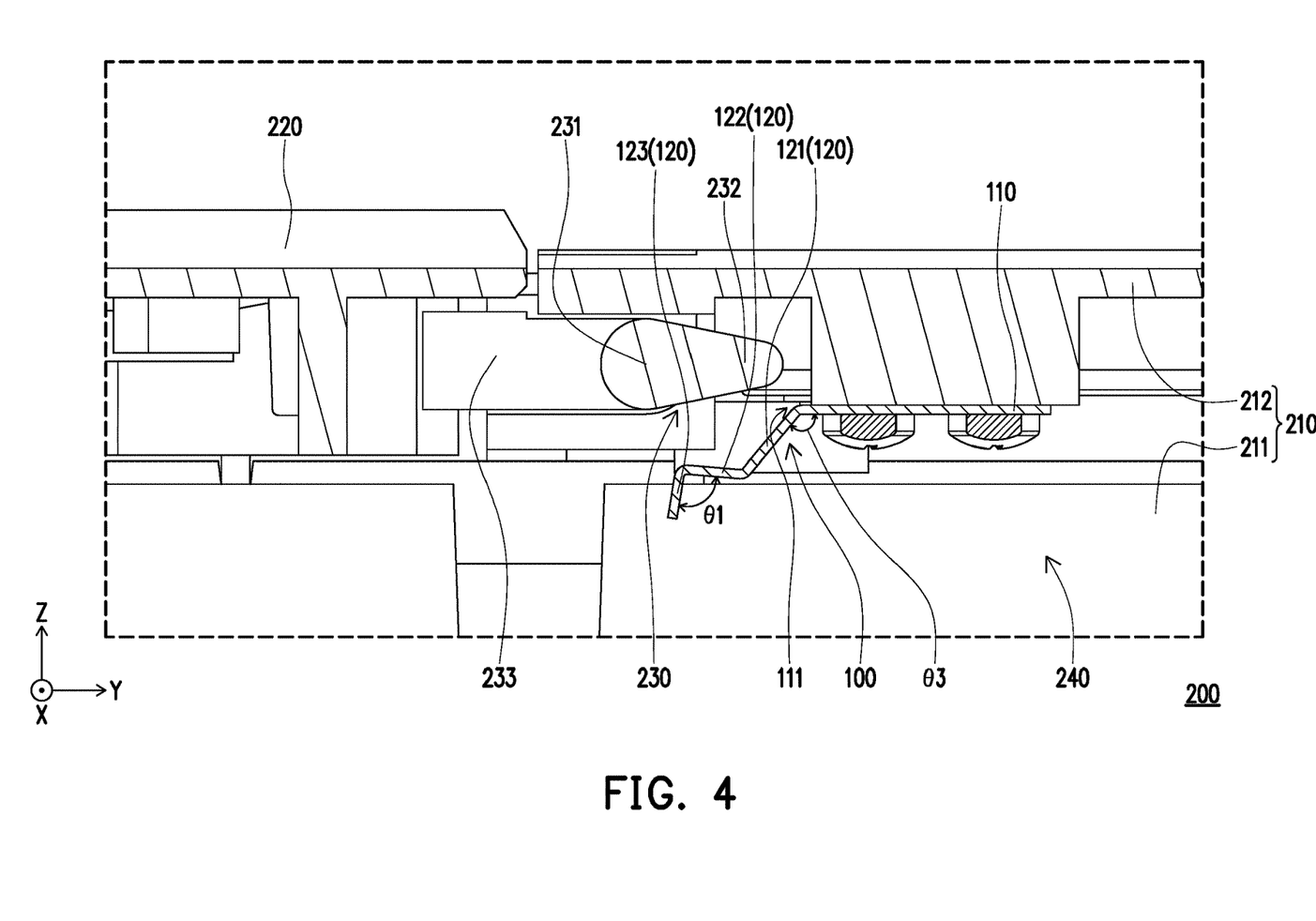
FIG. 4 is a partial cross-sectional schematic view of the openable and closable device of FIG. 1.
Figure 5:
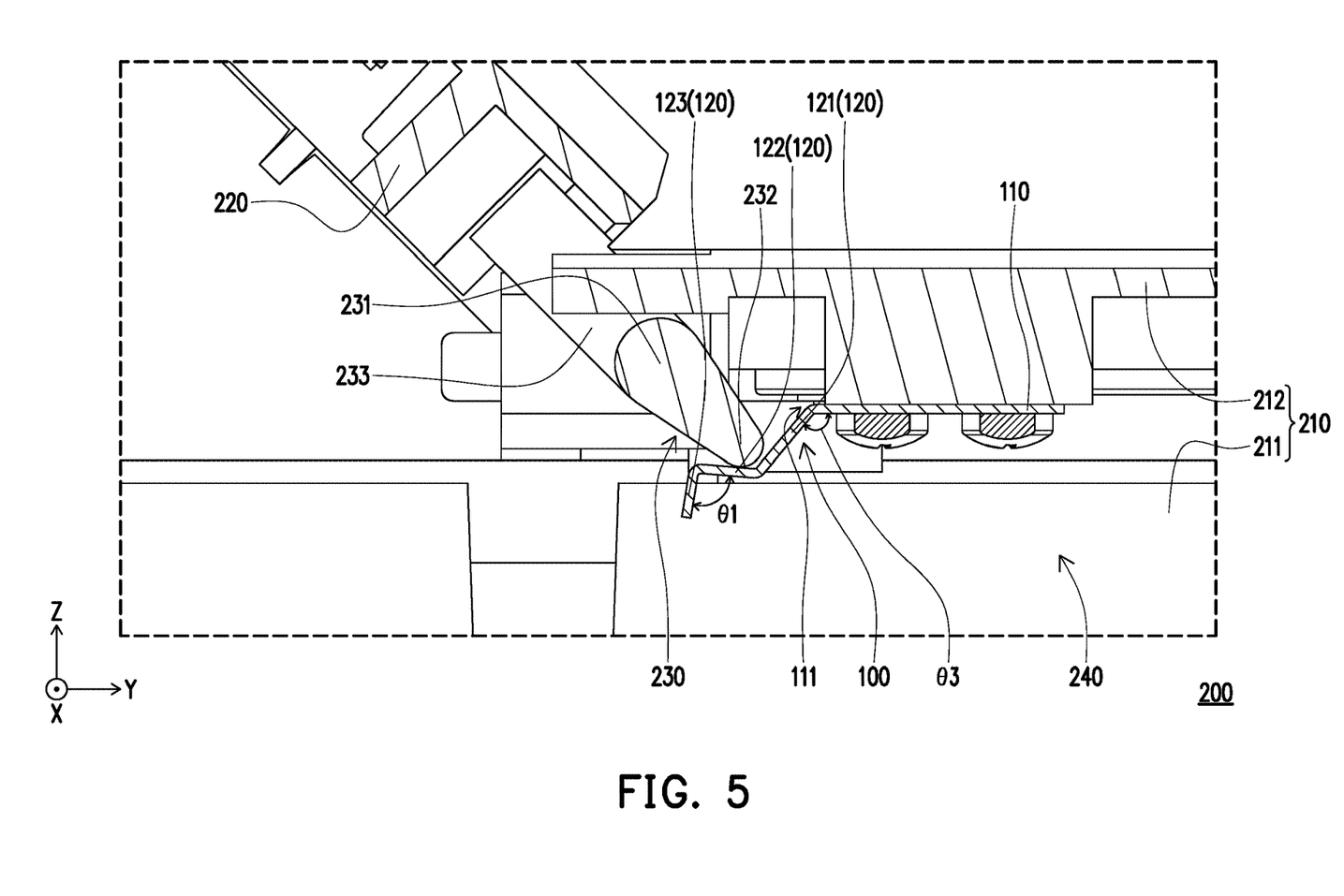
FIG. 5 to FIG. 7 are schematic views of a process of opening a door body of FIG. 4 relative to a case.
Figure 6:
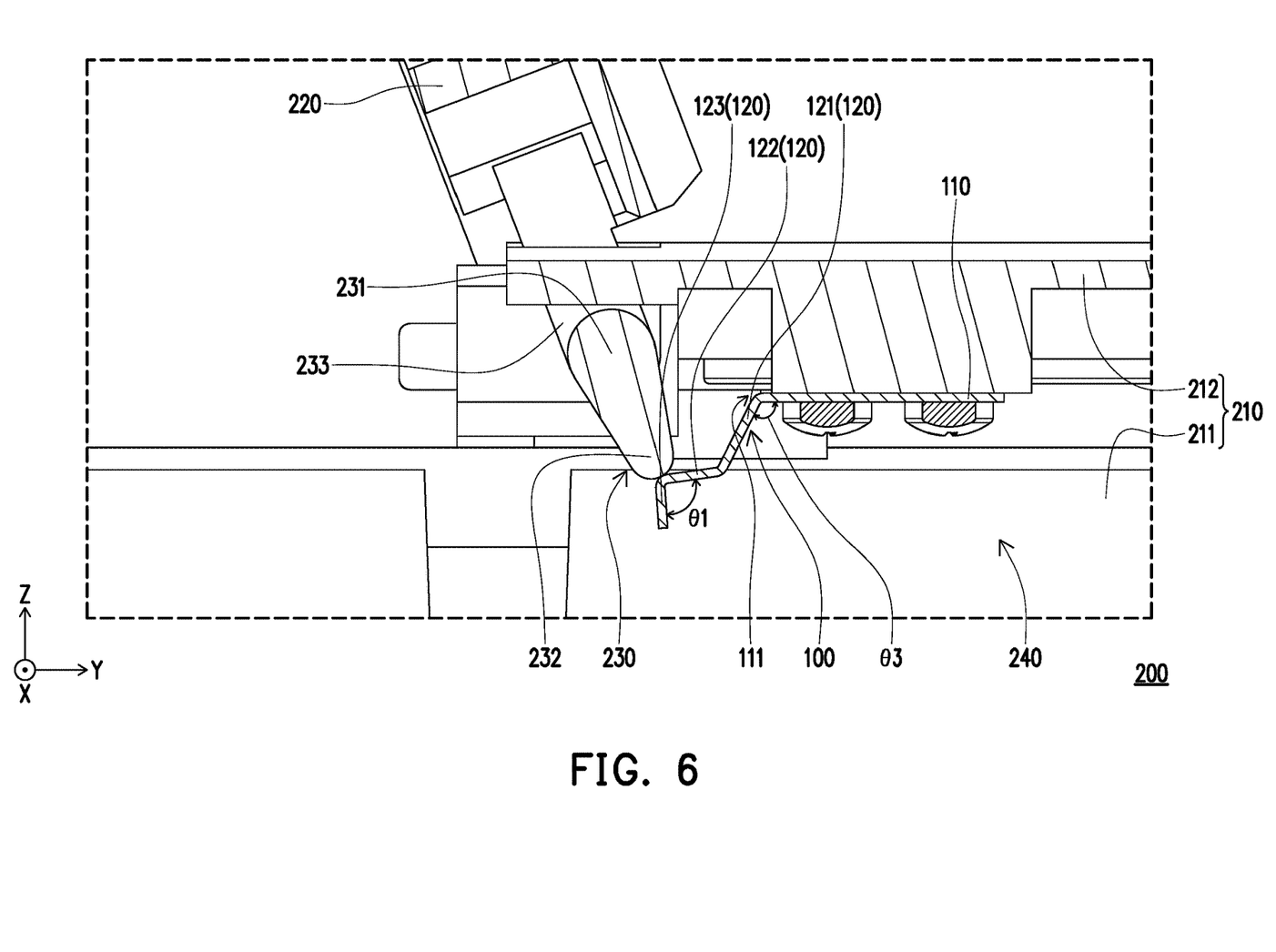
Figure 7:
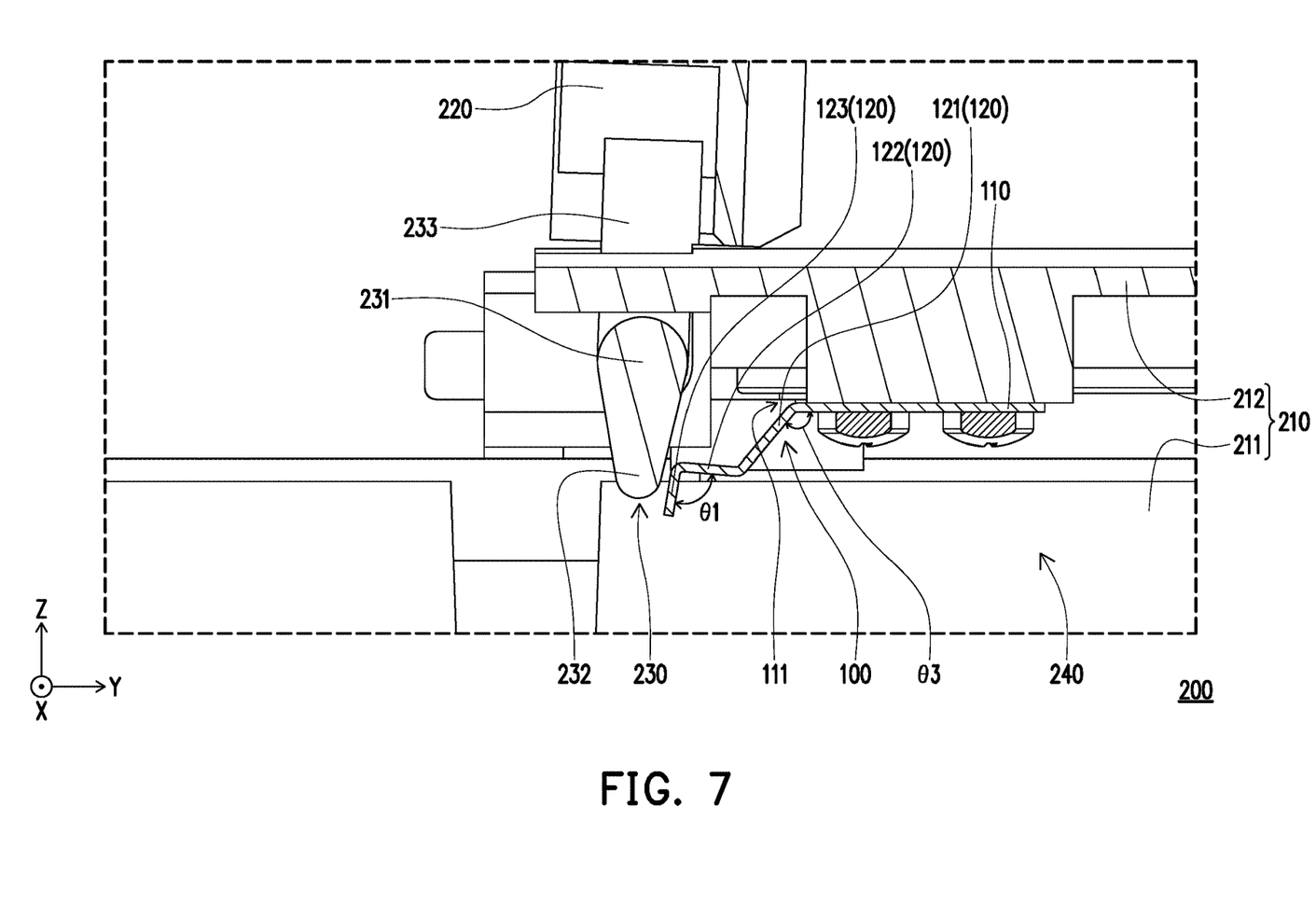
Figure 8:
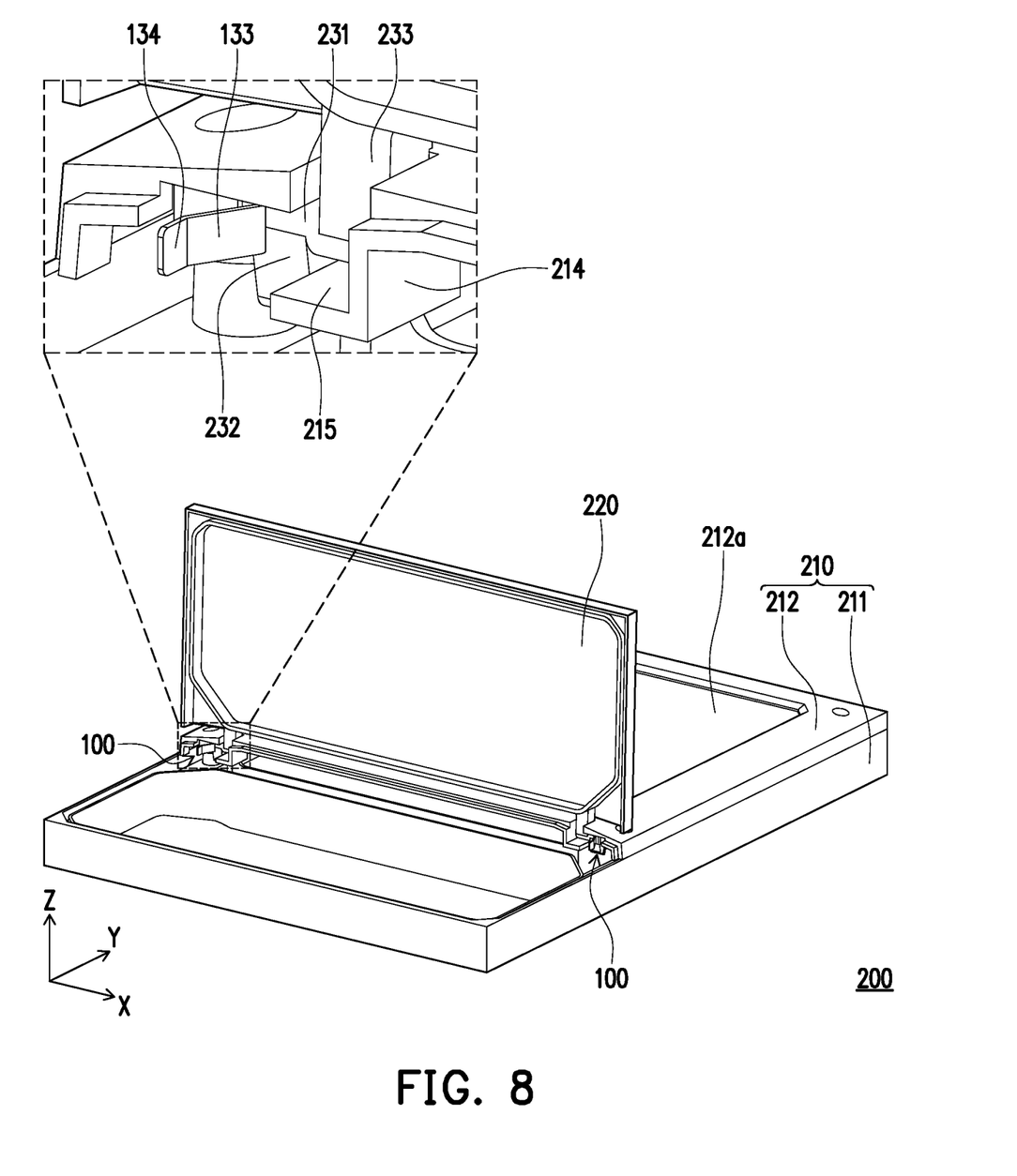
FIG. 8 is a three-dimensional schematic view of a door body of FIG. 1 after being opened relative to a case.

FIG. 4 is a partial cross-sectional schematic view of the openable and closable device of FIG. 1, wherein FIG. 4 shows a cross-section on the Y-Z plane of the quick-release positioning member on a side in the positive X-axis direction of FIG. 1. FIG. 5 to FIG. 7 are schematic views of a process of opening the door body relative to the case of FIG. 4. FIG. 8 is a three-dimensional schematic view of the door body of FIG. 1 after being opened relative to the case. Please refer to FIG. 2, FIG. 3, FIG. 4, and FIG. 9. The overall material of the quick-release positioning member 100 is metal, which may be elastically deformed and provide restoration force. The metal is preferably stainless steel, which may withstand harsh environments such as rainwater corrosion and exposure to sunlight and high temperature irradiation, and has excellent strength, thereby having longer service life, but the disclosure is not limited thereto.

In other embodiments, the material of the quick-release positioning member is, for example, plastic with certain elasticity.

In the embodiment, the first elastic portion 120 and the second elastic portion 130 are respectively connected to the fixing portion 110. The fixing portion 110 is roughly in the shape of a sheet and has two sides respectively located at the positive X-axis direction and the negative X-axis direction and two sides respectively located at the positive Y-axis direction and the negative Y-axis direction. The first elastic portion 120 is connected to the first side 111 of the fixing portion 110 at the negative Y-axis direction, and the second elastic portion 130 is connected to the second side 112 of the fixing portion 110 at the negative X-axis direction.

The first elastic portion 120 further includes a first connecting area 121 and a first blocking area 123. The first connecting area 121 is connected between the fixing portion 110 and the first bending area 122 and has an angle θ3 with respect to the fixing portion 110. The first connecting area 121 is connected to the first side 111 and extends toward the negative Y-axis direction and the negative Z-axis direction at the same time, so the extension direction of the first connecting area 121 is inclined to the extension direction of the fixing portion 110. The first bending area 122 is connected to the first connecting area 121, and the first bending area 122 approximately extends from the first connecting area 121 toward the negative Y-axis direction.

The first blocking area 123 is connected to the first bending area 122, the first blocking area 123 approximately extends from the first bending area 122 toward the negative Z-axis direction. The first bending area 122 is connected between the first connecting area 121 and the first blocking area 123, and the first blocking area 123 has a first angle θ1 with respect to the first bending area 122. For example, the first angle θ1 is between 90 and 150 degrees, and the angle of the first angle θ1 may be selected according to requirements. The first angle θ1 is, for example, 90 degrees, but the disclosure is not limited thereto.

The second elastic portion 130 further includes a second connecting area 131, a guiding area 133, and a force receiving area 134. The second connecting area 131 is connected between the fixing portion 110 and the second blocking area 132.

The second connecting area 131 is connected to the second side 112, and the second connecting area 131 extends from the fixing portion 110 toward the negative Y-axis direction. The second blocking area 132 is connected to the second connecting area 131 and extends from the second connecting area 131 toward the positive X-axis direction, and the second connecting area 131 is connected between the fixing portion 110 and the second blocking area 132. In other words, the extension direction of the second blocking area 132 is perpendicular to the extension direction of the second connecting area 131.

The guiding area 133 is connected to the second blocking area 132 and extends from the second blocking area 132 toward the negative X-axis direction and the negative Y-axis direction at the same time, and the second blocking area 132 is connected between the second connecting area 131 and the guiding area 133. In other words, the extension direction of the guiding area 133 is inclined to the extension direction of the second connecting area 131.

The force receiving area 134 is connected to the guiding area 133, extends from the guiding area 133 toward the negative Y-axis direction, and has an angle θ4 with respect to the guiding area 133. The protruding direction of the second blocking area 132 is substantially perpendicular to the extension direction of the second connecting area 131, and the extension direction of the guiding area 133 is inclined to the protruding direction of the second connecting area 131. When the door body 220 is opened, the staff may exert force on the force receiving area 134 to deform the second elastic portion 130 in the negative X-axis direction.

In terms of actual operation, the door body 220 is adapted to rotate according to the order shown in FIG. 4, FIG. 5, FIG. 6, and FIG. 7. During the process of the door body 220 rotating and opening relative to the lower cover 211, the first elastic portion 120 of the quick-release positioning member 100 is adapted to be forced toward the negative Z-axis direction by the protruding portion 232 and be elastically deformed toward the negative Z-axis direction, so as to be located outside the moving path of the protruding portion 232 to allow the protruding portion 232 to pass through.

Alternatively, in the state shown in FIG. 7 and FIG. 8, the first elastic portion 120 of the quick-release positioning member 100 is adapted to be located on the moving path of the protruding portion 232 to block the protruding portion 232 from passing through, so that the door body 220 can be positioned in an opened state, as shown in FIG. 7 and FIG. 8.

The door body 220 in FIG. 5 is closed relative to the case 210 and is in a closed state. The first elastic portion 120 has not received any force and has not been elastically deformed. The user may rotate the door body 220 around the X axis until the protruding portion 232 abuts against the first bending area 122 as shown in FIG. 5. Then, the user continues to rotate the door body 220 around the X axis. As can be seen from FIG. 6, the force exerted by the protruding portion 232 on the first bending area 122 enables the first connecting area 121, the first bending area 122, and the first blocking area 123 to be elastically deformed toward the negative Z-axis direction such that the first bending area 122 is located outside the moving path of the protruding portion 232 to allow the protruding portion 232 to pass through. The protruding portion 232 having passed through the first bending area 122 can be seen in FIG. 7. At this time, the force exerted on the first elastic portion 120 has been removed, and the energy accumulated in the first elastic portion 120 is released, so that the first elastic portion 120 returns to the original state.

Conversely, when the door body 220 is kept in the opened state, the first elastic portion 120 has not received any force and has not been elastically deformed. The user may rotate the door body 220 around the X axis until the protruding portion 232 abuts against the first blocking area 123. Then, the user continues to rotate the door body 220 around the X axis. As can be seen from FIG. 6, the force exerted by the protruding portion 232 on the first blocking area 123 enables the first connecting area 121, the first bending area 122, and the first blocking area 123 to be elastically deformed toward the negative Z-axis direction, and the first blocking area 123 is located outside the moving path of the protruding portion 232 to allow the protruding portion 232 to pass through. The protruding portion 232 having passed through the first bending area 122 can be seen in FIG. 5. At this time, the force exerted on the first elastic portion 120 has been removed, and the energy accumulated in the first elastic portion 120 is released, so that the first elastic portion 120 returns to the original state.

Therefore, when the staff installs or maintains the openable and closable device 200 at high altitudes, the first blocking area 123 in the first elastic portion 120 is located on the moving path of the protruding portion 232 to block the protruding portion 232, so that the door body 220 is kept in the opened state. As such, hands are freed up to perform installation and maintenance operations of an electronic component, a luminary, etc. inside the openable and closable device 200, which has excellent convenience.

Figure 9:
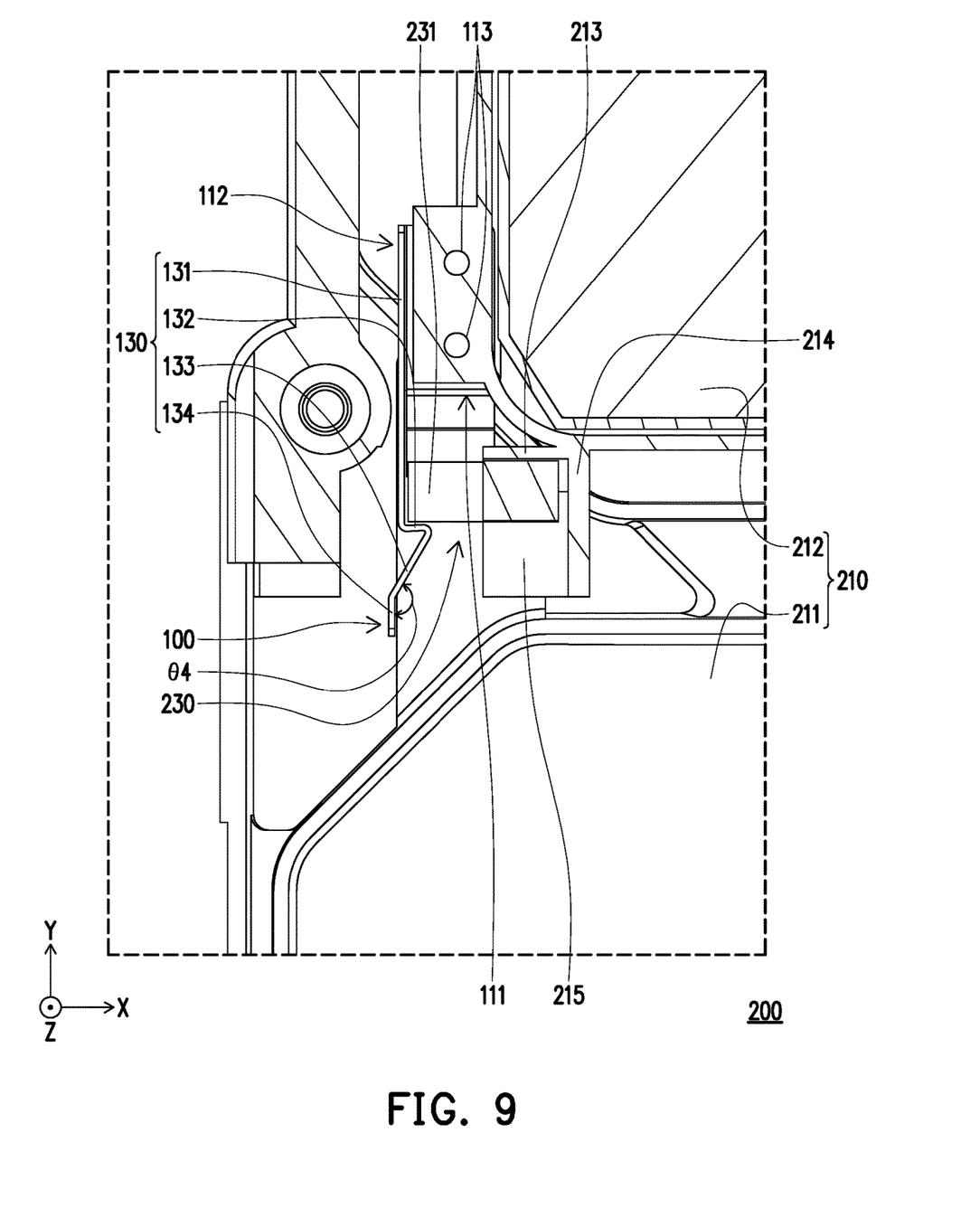
FIG. 9 is a partial cross-sectional schematic view of an openable and closable device of FIG. 8.
Figure 10:
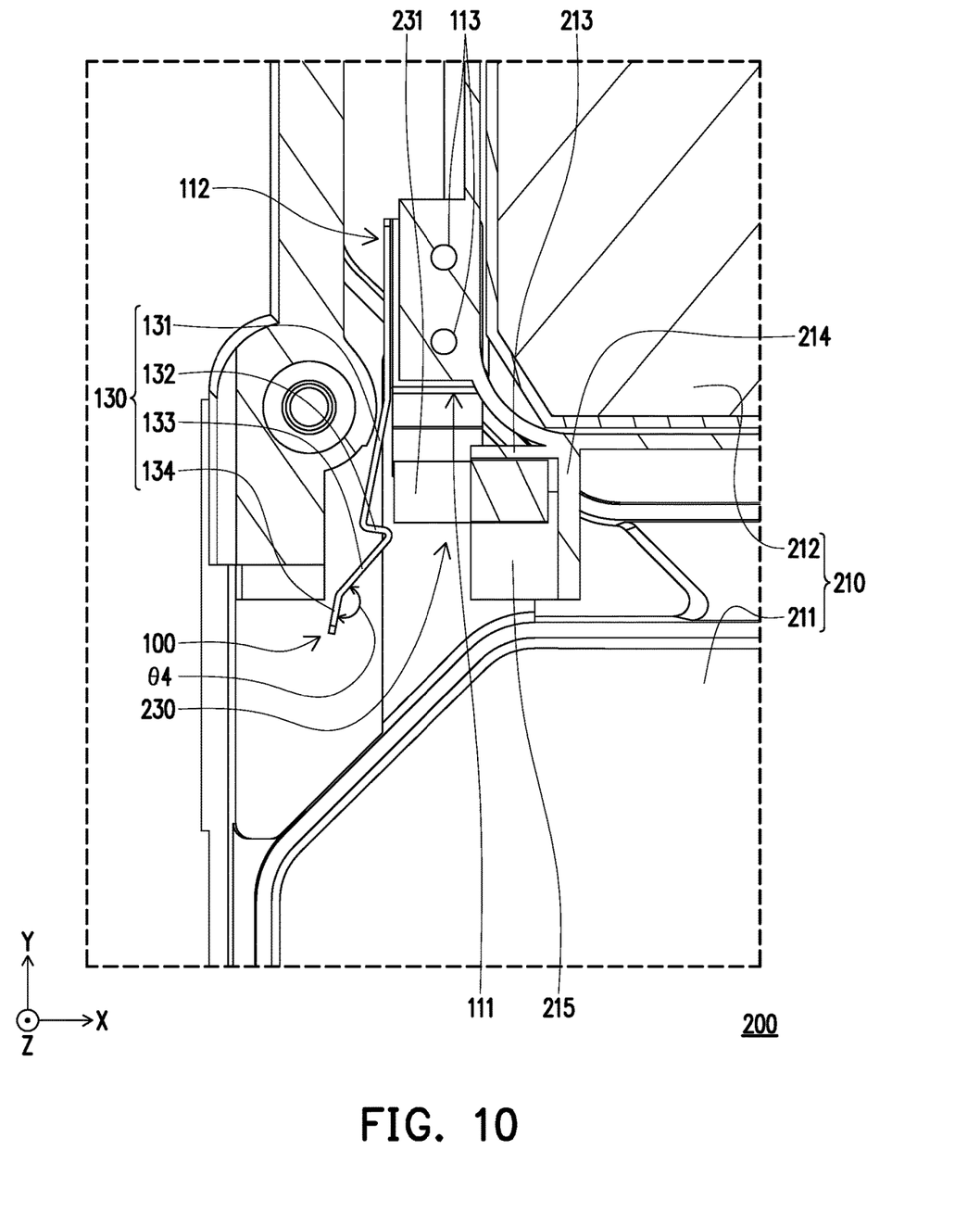
FIG. 10 and FIG. 11 are schematic views of a process of disassembling a door body of FIG. 9 from a case.
Figure 11:
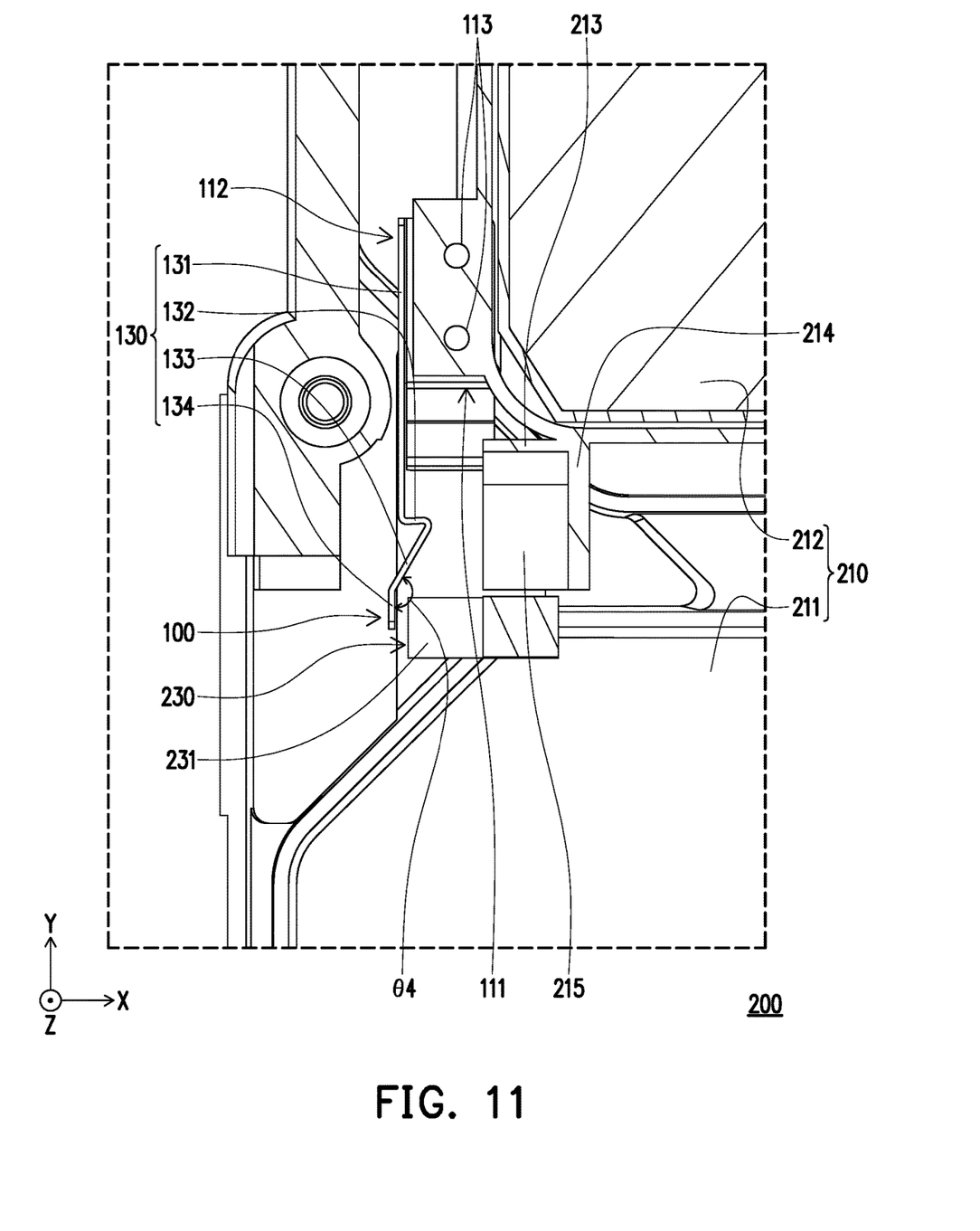
Figure 12:
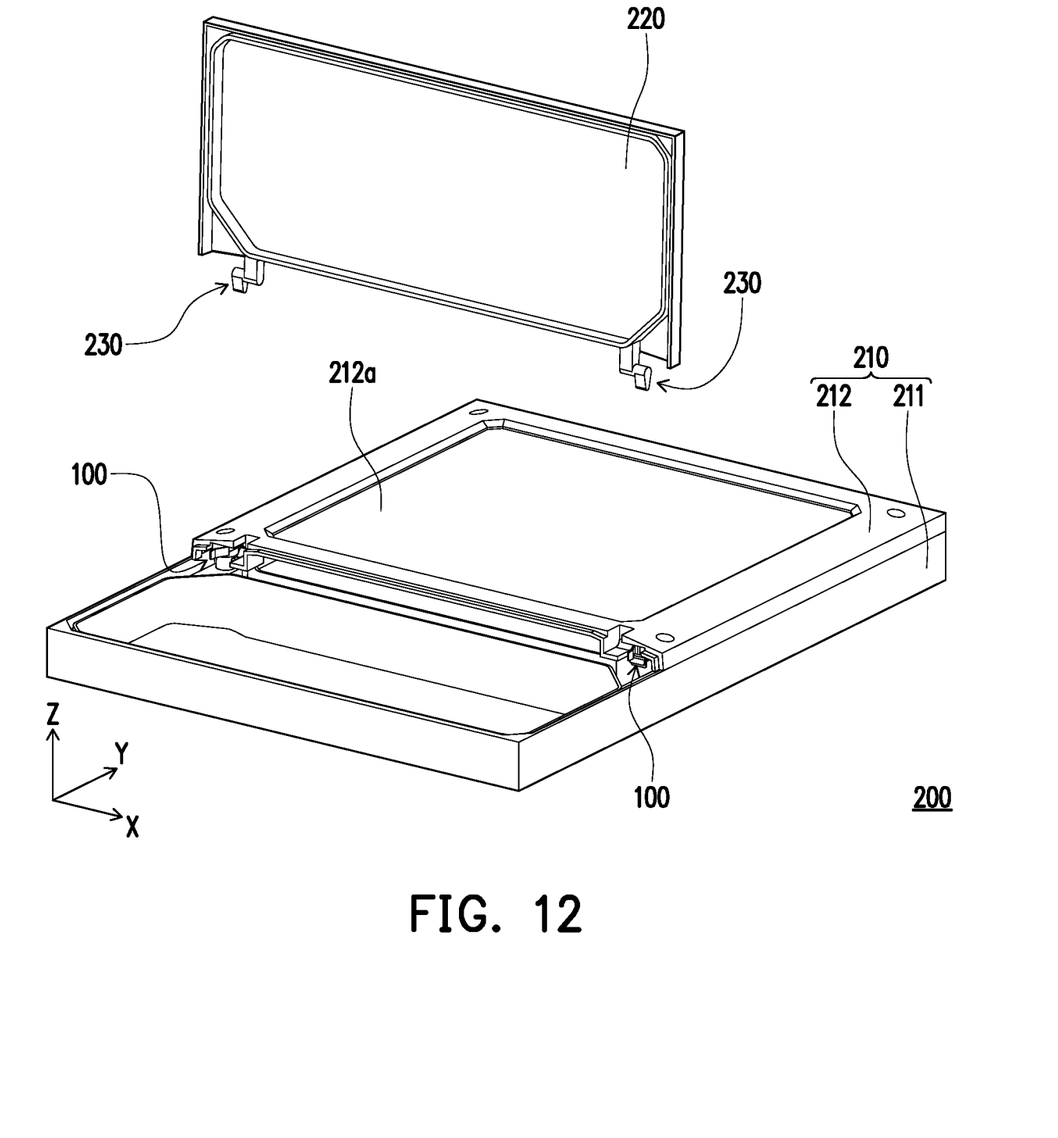
FIG. 12 is a schematic view of a door body of FIG. 8 after being disassembled from a case.

FIG. 9 is a partial cross-sectional schematic view of an openable and closable device of FIG. 8, wherein FIG. 9 shows a cross-section on the X-Y plane of the quick-release positioning member on a side in the negative X-axis direction of FIG. 1. FIG. 10 and FIG. 11 are schematic views of a process of disassembling a door body of FIG. 9 relative to a case. FIG. 12 is a schematic view of a door body of FIG. 8 after being disassembled from a case. The second elastic portion 130 is adapted to be located on the moving path of the shaft portion 231 along the negative Y-axis direction as shown in FIG. 9 to block the shaft portion 231 from passing through. Alternatively, the second elastic portion 130 is adapted to be elastically deformed along the negative X-axis direction under force according to the order shown in FIG. 9 and FIG. 10 to be located outside the moving path of the shaft portion 231 along the negative Y-axis direction, so as to allow the shaft portion 231 to pass through along the negative Y-axis direction according to the order shown in FIG. 10 and FIG. 11, thereby allowing the door body 220 to be quickly disassembled from the case 210 as shown in FIG. 12.

Specifically, the door body 220 in FIG. 9 is opened relative to the case 210 and is in an opened state. The state is also shown in the three-dimensional view of FIG. 8. The second elastic portion 130 has not received any force and has not been elastically deformed. The user may exert force on the force receiving area 134 to move the force receiving area 134 toward the negative X-axis direction until the second blocking area 132 moves outside the moving path of the shaft portion 231 as shown in FIG. 10 to allow the shaft portion 231 to pass through. At this time, the user may move the door body 220 toward the negative Y-axis direction. As can be seen from FIG. 11, the shaft portion 231 passes through the first bending area 122, the user may remove the force exerted on the force receiving area 134, and the energy accumulated in the second elastic portion 130 is released, so that the second elastic portion 130 returns to the original state.

Conversely, when the disassembled door body 220 needs to be installed back to the case 210, the user may align the shaft portion 231 with the guiding area 133 as shown in FIG. 11. Then, the user exerts force, so that the door body 220 moves toward the positive Y-axis direction, the shaft portion 231 slides over the surface of the guiding area 133 and push the guiding area 133 to move toward the negative X-axis direction, so as to force the guiding area 133 and the second blocking area 132 to move outside the moving path of the shaft portion 231, thereby allowing the shaft portion 231 to pass through. As can be seen from FIG. 10, the shaft portion 231 has completely passed through the guiding area 133 and the second blocking area 132. At this time, the shaft portion 231 has completely passed through the guiding area 133 and the second blocking area 132, and the force exerted on the guiding area 133 is removed. The energy accumulated in the second elastic portion 130 is therefore released, and the second elastic portion 130 returns to the original state shown in FIG. 9. As such, the door body 220 may be firmly installed on the case 210 to prevent falling off, so the installation is quick and simple, and does not require any tools.

Therefore, in the openable and closable device 200 of the disclosure, the door body 220 may be detachably installed on the case 210 through the quick-release positioning member 100, so the door body 220 may be installed on the case 210 or disassembled from the case 210 without any tools. The staff may install and maintain the openable and closable device 200 without any tools, which has excellent convenience and helps to shorten the time taken by the staff to operate at high altitudes and increase the safety of work.

Please refer to FIG. 2, FIG. 3, and FIG. 9. The upper cover 212 has a first side wall 213, a second side wall 214, and a bottom wall 215. The first side wall 213, the second side wall 214, the bottom wall 215, and the second connecting area 131 and the second blocking area 132 of the second elastic portion 130 surround the shaft portion 231 to limit the movement of the shaft portion 231 in the positive and negative X-axis direction, the positive and negative Y-axis direction, and the positive and negative Z-axis direction. In other words, the door body 220 may be detachably installed on the upper cover 212, and the door body 220 may only rotate forward or reverse around the X axis through this structure.

It should be noted that although the quick-release positioning member 100 of the disclosure is exemplified by being provided on both sides in FIG. 1 to FIG. 12, the disclosure is not limited thereto.

In other embodiments, the quick-release positioning member may only be provided on a single side of the lamp, and pivoting members, such as a combination of a shaft and a pivoting hole, may be provided on the other side. The shaft on one side may be first inserted into the corresponding pivoting hole, and then the other side may be installed and positioned by the quick-release positioning member, which may also achieve the quick installation and quick disassembly of the disclosure.

Figure 13:
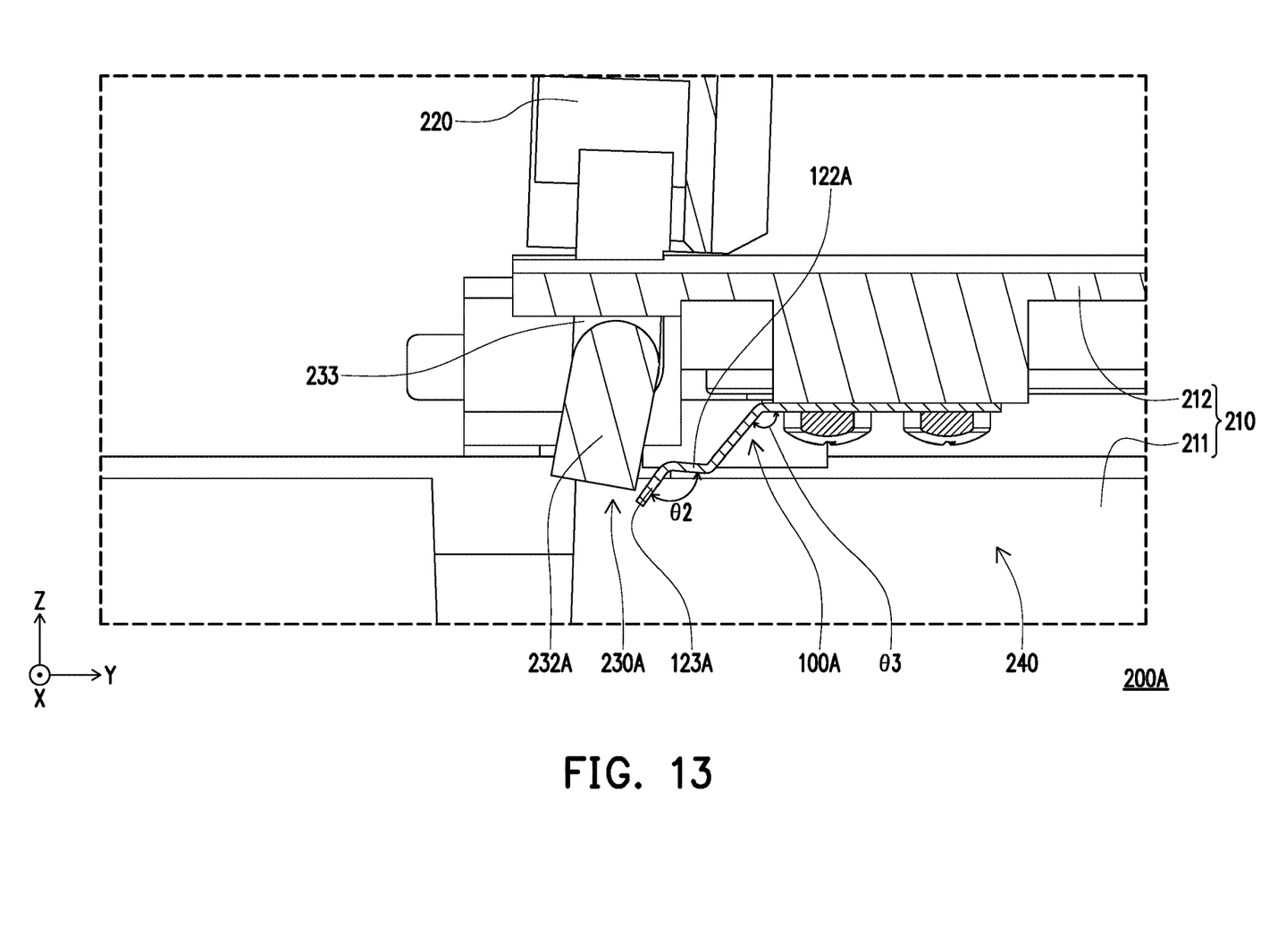
FIG. 13 is a cross-sectional schematic view of an openable and closable device according to another embodiment of the disclosure.

FIG. 13 is a cross-sectional schematic view of an openable and closable device according to another embodiment of the disclosure. Please refer to FIG. 13. The quick-release positioning member 100A and an openable and closable device 200A of this embodiment are different from the quick-release positioning member 100 and the openable and closable device 200 of the foregoing embodiment in that, in the quick-release positioning member 100A, a second angle θ2 between a first bending area 122A and a first blocking area 123A is greater, such as but not limited to 120 degrees. In addition, in a movable member 230A, a protruding portion 232A is in the shape of a square.

In summary, in the quick-release positioning member of the disclosure, the first elastic portion and the second elastic portion are adapted to receive force to generate elastic deformation. The first elastic portion pivots about an axis extending in the second direction, and the second elastic portion pivots about an axis extending in the third direction, which can help to solve the issue that the installed product needs to cooperate with tools for operations such as installation, maintenance, and disassembly, and can assist the casing of the product to be positionably opened and closed to facilitate operation.

In addition, in the openable and closable device of the disclosure, the movable member is adapted to relatively rotate the door body and the case, and the quick-release positioning member enables the door body and the case to be relatively detachable. The protruding portion of the movable member is adapted to slide on the first elastic portion of the quick-release positioning member, and the first elastic portion is adapted to block the protruding portion from passing through or be forced by the protruding portion to allow the protruding portion to pass through, which can help to solve the issue that the openable and closable device needs to cooperate with tools for operations such as installation, maintenance, and disassembly, and can assist the casing thereof to be positionably opened and closed to facilitate operation.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A quick-release positioning member, comprising:
   a fixing portion, adapted to fix the quick-release positioning member to an object;
   a first elastic portion, connected to a first side of the fixing portion, the first elastic portion extending toward a first direction and having a first bending area protruding away from the fixing portion; and
   a second elastic portion, connected to a second side of the fixing portion, the second elastic portion extending toward the first direction and having a second blocking area protruding toward the fixing portion,
   wherein the first elastic portion and the second elastic portion are adapted to be elastically deformed upon exertion of force, the first elastic portion pivots about an axis extending in a second direction, the second elastic portion pivots about an axis extending in a third direction, and the first direction, the second direction, and the third direction are substantially orthogonal to each other.

2. The quick-release positioning member according to claim 1, wherein the first elastic portion further comprises:
   a first connecting area, connected between the fixing portion and the first bending area, and having an angle with respect to the fixing portion; and
   a first blocking area, connected to the first bending area, the first blocking area having a first angle with respect to the first bending area.

3. The quick-release positioning member according to claim 2, wherein the first angle is between 90° and 150°.

4. The quick-release positioning member according to claim 1, wherein the second elastic portion further comprises:
   a second connecting area, connected between the fixing portion and the second blocking area; and
   a guiding area, connected to the second blocking area.

5. The quick-release positioning member according to claim 4, wherein a protruding direction of the second blocking area is substantially perpendicular to an extension direction of the second connecting area.

6. The quick-release positioning member according to claim 4, wherein an extension direction of the guiding area is inclined to a protruding direction of the second connecting area.

7. The quick-release positioning member according to claim 4, wherein the second elastic portion further comprises:
   a force receiving area, connected to the guiding area and having an angle with respect to the guiding area.

8. The quick-release positioning member according to claim 1, wherein the fixing portion has an opening.

9. An openable and closable device, comprising:
   a case;
   a door body;
   a movable member, the movable member having a shaft portion and a protruding portion extending from the shaft portion; and
   a quick-release positioning member, comprising:
      a fixing portion, adapted to fix the quick-release positioning member to an object;
      a first elastic portion, connected to a first side of the fixing portion, the first elastic portion extending toward a first direction and having a first bending area protruding away from the fixing portion; and
      a second elastic portion, connected to a second side of the fixing portion, the second elastic portion extending toward the first direction and having a second blocking area protruding toward the fixing portion,
      wherein the first elastic portion and the second elastic portion are adapted to be elastically deformed upon exertion of force, the first elastic portion pivots about an axis extending in a second direction, the second elastic portion pivots about an axis extending in a third direction, and the first direction, the second direction, and the third direction are substantially orthogonal to each other, wherein the movable member is disposed on one of the case and the door body, the quick-release positioning member is disposed on other one of the case and the door body, the movable member is adapted to relatively rotate the door body and the case, and the quick-release positioning member enables the door body and the case to be relatively detachable, wherein the protruding portion of the movable member is adapted to slide on the first elastic portion of the quick-release positioning member, and the first elastic portion is adapted to block the protruding portion from passing through or be forced by the protruding portion to allow the protruding portion to pass through.

10. The openable and closable device according to claim 9, wherein the first elastic portion further comprises:
a first connecting area, connected between the fixing portion and the first bending area, and having an angle with respect to the fixing portion; and
a first blocking area, connected to the first bending area, the first blocking area having a first angle with respect to the first bending area.

11. The openable and closable device according to claim 10, wherein the first angle is between 90° and 150°.

12. The openable and closable device according to claim 9, wherein the second elastic portion further comprises:
a second connecting area, connected between the fixing portion and the second blocking area; and
a guiding area, connected to the second blocking area.

13. The openable and closable device according to claim 12, wherein a protruding direction of the second blocking area is substantially perpendicular to an extension direction of the second connecting area.

14. The openable and closable device according to claim 12, wherein an extension direction of the guiding area is inclined to a protruding direction of the second connecting area.

15. The openable and closable device according to claim 12, wherein the second elastic portion further comprises:
a force receiving area, connected to the guiding area and having an angle with respect to the guiding area.

16. The openable and closable device according to claim 9, wherein the fixing portion has an opening.

17. The openable and closable device according to claim 9, wherein the second elastic portion of the quick-release positioning member is adapted to be located on a moving path of the shaft portion to block the shaft portion from passing through or be elastically deformed upon force to be located outside the moving path of the shaft portion to allow the shaft portion to pass through.

18. The openable and closable device according to claim 9, wherein the case comprises:
a lower cover; and
an upper cover, disposed on the lower cover,
wherein one of the quick-release positioning member and the movable member is adapted to be disposed on one of the lower cover and the upper cover, and other one of the quick-release positioning member and the movable member is adapted to be disposed on the door body.

19. The openable and closable device according to claim 9, wherein the case has a first side wall, a second side wall, and a bottom wall, and the first side wall, the second side wall, the bottom wall, and the second elastic portion surround to accommodate the shaft portion and limit movement of the shaft portion.

* * * * *